(12) United States Patent  
Nebat

(10) Patent No.: US 8,261,164 B2  
(45) Date of Patent: Sep. 4, 2012

(54) PACKET ERROR RATE CORRELATION MINIMIZATION

(75) Inventor: Yoav Nebat, San Diego, CA (US)

(73) Assignee: Wi-LAN, Inc., Ottawa, Ontario (CA)

( * ) Notice: Subject to any disclaimer, the term of this patent is extended or adjusted under 35 U.S.C. 154(b) by 956 days.

(21) Appl. No.: 12/202,180

(22) Filed: Aug. 29, 2008

(65) Prior Publication Data

US 2009/0150742 A1  Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.  
*H03M 13/00* (2006.01)

(52) U.S. Cl. ...................................... 714/785

(58) Field of Classification Search .......... 714/747–753, 714/755, 756, 758, 760, 784–791, 798–801  
See application file for complete search history.

(56) References Cited

U.S. PATENT DOCUMENTS

| | | | |
|---|---|---|---|
| 5,546,409 A | 8/1996 | Karasawa | |
| 5,826,018 A | 10/1998 | Vixie et al. | |
| 5,983,383 A | 11/1999 | Wolf | |
| 6,021,433 A * | 2/2000 | Payne et al. | 709/219 |
| 6,085,253 A * | 7/2000 | Blackwell et al. | 709/235 |
| 7,031,249 B2 | 4/2006 | Kowalski | |
| 7,058,027 B1 | 6/2006 | Alessi et al. | |
| 7,343,540 B2 * | 3/2008 | Khermosh et al. | 714/758 |
| 7,464,319 B2 * | 12/2008 | Budge et al. | 714/762 |
| 7,644,343 B2 | 1/2010 | Gubbi et al. | |
| 7,660,245 B1 * | 2/2010 | Luby | 370/230 |
| 7,877,663 B2 | 1/2011 | Vesma et al. | |
| 2002/0147954 A1 | 10/2002 | Shea | |
| 2003/0081564 A1 | 5/2003 | Chan | |
| 2003/0207696 A1 | 11/2003 | Willenegger et al. | |
| 2003/0226092 A1 | 12/2003 | Kim et al. | |
| 2004/0090932 A1 | 5/2004 | Wei et al. | |

(Continued)

FOREIGN PATENT DOCUMENTS

EP  1 718 096  11/2006

(Continued)

OTHER PUBLICATIONS

Agashe et al., "CDMA2000 High Rate Broadcast Packet Data Air Interface Design," IEEE Comm. Magazine, pp. 83-89 (Feb. 2004).

(Continued)

*Primary Examiner* — Nadeem Iqbal  
(74) *Attorney, Agent, or Firm* — Volpe and Koenig, P.C.

(57) ABSTRACT

The subject matter disclosed herein provides an outer coding framework for reducing the correlation between packet errors in a wireless network. In one aspect, there is provided a method. The method may include receiving a packet including information. The received packet may be encoded using a forward error correction code to provide at least one, but no more than two, codewords. At least a portion of each codeword may be inserted into a transport packet for transmission to a client station, wherein the transport packet comprises information from at least one, but no more than two, of the codewords. The transport packet may be sent. Related systems, apparatus, methods, and/or articles are also described.

16 Claims, 12 Drawing Sheets

U.S. PATENT DOCUMENTS

| | | | |
|---|---|---|---|
| 2004/0100937 A1 | 5/2004 | Chen | |
| 2004/0199847 A1 | 10/2004 | Calabro et al. | |
| 2004/0199850 A1 | 10/2004 | Yi et al. | |
| 2004/0243913 A1* | 12/2004 | Budge et al. | 714/776 |
| 2005/0005189 A1* | 1/2005 | Khermosh et al. | 714/4 |
| 2005/0135308 A1 | 6/2005 | Vijayan et al. | |
| 2006/0013168 A1 | 1/2006 | Agrawal et al. | |
| 2006/0077890 A1 | 4/2006 | Suryavanshi et al. | |
| 2006/0248430 A1 | 11/2006 | Iancu et al. | |
| 2007/0004437 A1 | 1/2007 | Harada et al. | |
| 2007/0101228 A1 | 5/2007 | Vesma et al. | |
| 2007/0165578 A1 | 7/2007 | Yee et al. | |
| 2007/0230351 A1 | 10/2007 | Dang | |
| 2007/0240027 A1 | 10/2007 | Vesma et al. | |
| 2007/0253367 A1 | 11/2007 | Dang et al. | |
| 2007/0268933 A1 | 11/2007 | Wu et al. | |
| 2008/0022345 A1 | 1/2008 | Kim et al. | |
| 2008/0098283 A1* | 4/2008 | Vayanos et al. | 714/774 |
| 2008/0225819 A1 | 9/2008 | Niu et al. | |
| 2009/0259920 A1 | 10/2009 | Guo et al. | |
| 2010/0115379 A1 | 5/2010 | Gubbi et al. | |
| 2010/0183077 A1 | 7/2010 | Lee et al. | |
| 2011/0235724 A1 | 9/2011 | Kim et al. | |

FOREIGN PATENT DOCUMENTS

| | | |
|---|---|---|
| KR | 10-1995-0010768 | 9/1995 |
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 2005/022814 | 3/2005 |

OTHER PUBLICATIONS

Form PCT/ISA/220, Notification of Transmittal of the International Search Report and the Written Opinion of the International Searching Authority, or the Declaration, mailed May 18, 2009.

Form PCT/ISA/220, Notification of Transmittal of the International Search Report and the Written Opinion of the International Searching Authority, or the Declaration, mailed Apr. 30, 2009.

Form PCT/ISA/220, Notification of Transmittal of the International Search Report and the Written Opinion of the International Searching Authority, or the Declaration, mailed Apr. 20, 2009.

Form PCT/ISA/220, Notification of Transmittal of the International Search Report and the Written Opinion of the International Searching Authority, or the Declaration, mailed May 26, 2009.

Form PCT/ISA/220, Notification of Transmittal of the International Search Report and the Written Opinion of the International Searching Authority, or the Declaration, mailed Jun. 24, 2009 for corresponding PCT Application PCT/US2008/086103.

Form PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16lpc-00/33, "FEC Performance of Concatenated Reed Solomon and Convolutional Coding with Interleaving," (Jun. 8, 2000).

IEEE 802.16 Broadband Wireless Access Working Group, IEEE 802.161maint-08/293, "Optional outer-coded data mode for MBS," (Sep. 11, 2008).

Jenkac et al., "Flexible outer Reed-Solomon coding on RLC layer for MBMS over GERAN," Vehicular Technology Conference. vol. 5, pp. 2777-2781 (May 2004).

Patent Cooperation Treaty (PCT) International Search Report, PCT/US2008/085984, Notification of Transmittal of the International Search Authority and the Written Opinion of the International Searching Authority, or the Declaration, mail date Mar. 27, 2009, 11 pages.

Pursley et al., "Variable-Rate Coding for Meteor-Burst Communications," IEEE Trans. On Comm., vol. 37, No. 11 (Nov. 1989).

Qualcomm, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. On Comm., vol. 6, No. 6 (Nov. 2004).

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

* cited by examiner

PACKET ERROR RATE CORRELATION MINIMIZATION

CROSS REFERENCE TO RELATED APPLICATION

This application claims the benefit under 35 U.S.C. §119(e) of the following provisional applications, all of which are incorporated herein by reference in their entirety: U.S. Ser. No. 61/007,360, entitled "Multimedia Broadcast System," filed Dec. 11, 2007; U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008; and U.S. Ser. No. 61/060,117, entitled "Multimedia Broadcast System," filed Jun. 9, 2008.

FIELD

The subject matter described herein relates to wireless communications.

BACKGROUND

Channel coding, such as forward error-correction coding or error-correction coding, introduces redundancy into a signal prior to transmission or storage of the signal. The redundancy enables a receiving system to detect and, perhaps, correct errors introduced into the signal by, for example, the channel, receiver, transmitter, storage medium, and the like. For example, in a communication system that employs forward error-correction coding, a source provides data to an encoder (also referred to as a coder). The encoder inserts redundant (also sometimes referred to as parity) bits, thereby outputting a longer sequence of code bits, called a codeword. The codewords can then be transmitted to a receiver, which uses a suitable decoder to extract the original, uuencoded data and correct errors caused by, for example, the channel and/or the receiver.

Channel coding can thus be used to detect and/or correct errors—reducing the need for the source transmitter to retransmit data received in error. By reducing the need to retransmit data that is in error, the throughput of the channel or link is improved. Moreover, the correction of errors also improves the quality of the data received at the receiver. In the case of a digital video broadcast, error-correction coding enhances not only the quality of the digital video broadcast over the wireless channel but also improves the throughput of the wireless channel.

SUMMARY

The subject matter disclosed herein provides an outer coding framework for, in some implementations, reducing the correlation between packet errors in a wireless network.

In one aspect, there is provided a method. The method may include receiving a packet comprising information. The received packet may be encoded using a forward error correction code to provide at least one, but no more than two, codewords. At least a portion of each codeword may be inserted into a transport packet for transmission to a client station, wherein the transport packet comprises information from at least one, but no more than two, of the codewords. The transport packet may be sent.

In one aspect, there is provided a method. The method may include receiving a transport packet; obtaining at least a portion of at least one, but no more than two, codewords from the transport packet, wherein the codewords were encoded using a forward error correction code; decoding the codewords to obtain at least one application packet, wherein each codeword includes at least a portion of one, but no more than two, application packets; and providing the decoded application packet.

In another aspect, there is provided a method. The method may include receiving a packet comprising a number of information bits wherein the number of information bits is less than or equal to a maximum packet size; inserting the packet into a code block, wherein the code block when encoded comprises a number of codewords each capable of carrying a particular number of information bits, and wherein the number of codewords is the smallest number of codewords enabling the code block to hold a packet with a size equal to the maximum packet size; encoding the code block using a forward error correction code to provide the number of codewords; inserting at least a portion of the code block into a transport packet for transmission to a client station, wherein the transport packet comprises information from no more than two code blocks; and sending the transport packet.

Variations of the above aspects may include one or more of the following features. The packet may be sized based on a size parameter of the forward error correction code by parsing the packet if the packet has a size exceeding the size parameter to provide two sub-packets. The received packet may be encoded by encoding each sub-packet to provide a corresponding codeword. The encoded packet may be inserted into another packet for transmission to a client station. At least a portion of the packet may be encoded as a block. The block may be sized according to a size parameter of the forward error correction code. The forward error correction code may be implemented as a Reed-Solomon forward-error correction code. The transport packet may be encoded using a second code. The transport packet may be a hybrid automatic retransmission request (HARQ) protocol data unit (PDU) that comprises a cyclic-redundancy check (CRC) and a header.

Moreover, one or more of the above note aspects and features may be embodied as a computer-readable medium (e.g., a computer-readable medium containing instructions to configure a processor to perform a method noted herein). In addition, one or more of the above note aspects and features may be embodied as a system (e.g., a system comprising at least one processor and at least one memory, wherein the at least one processor and the at least one memory are configured to provide a method noted herein).

The details of one or more variations of the subject matter described herein are set forth in the accompanying drawings and the description below. Features and advantages of the subject matter described herein will be apparent from the description and drawings, and from the claims.

Figure 1:
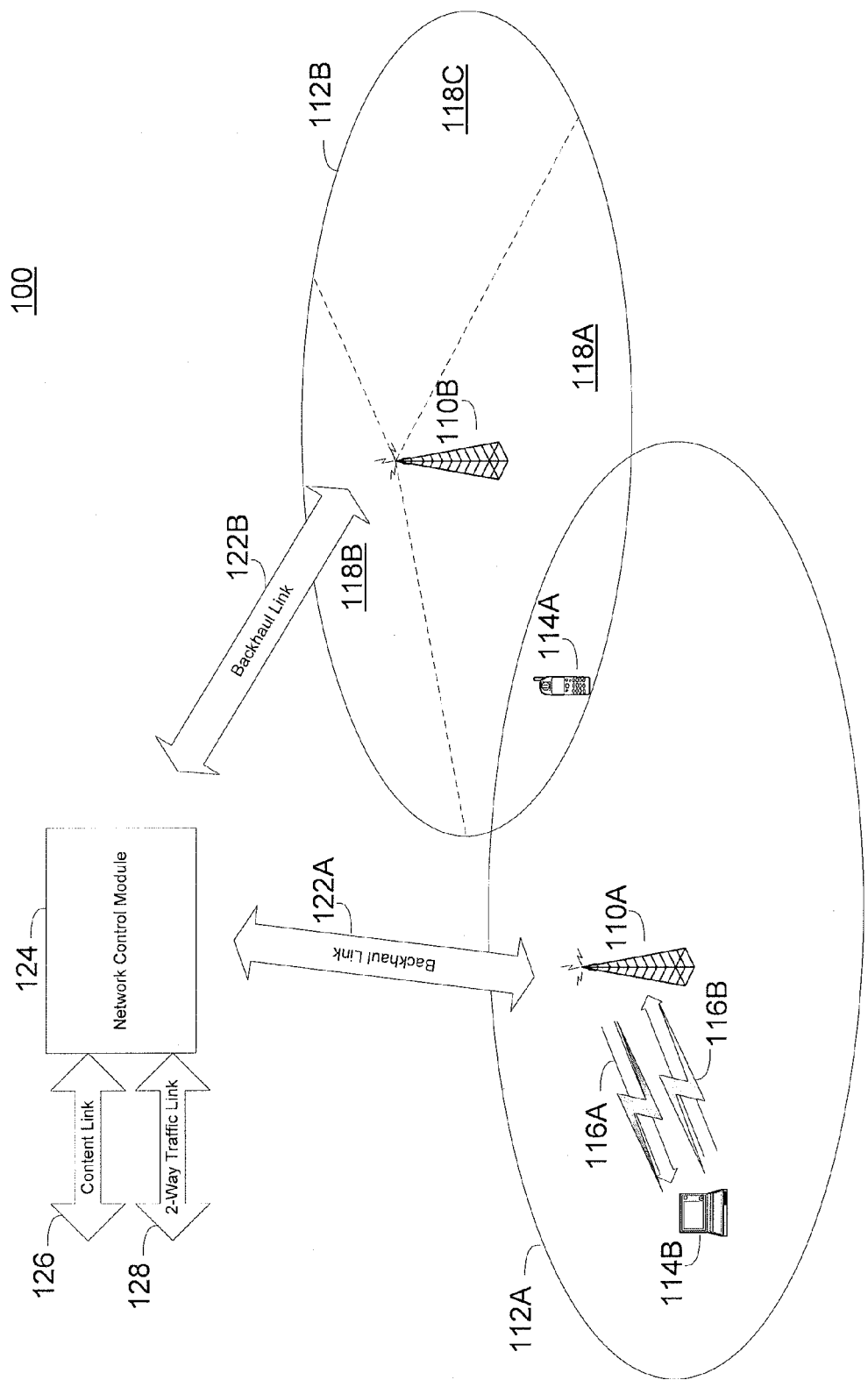
FIG. 1 depicts a block diagram of a network including client stations and base stations.

Like labels are used to refer to same or similar items in the drawings.

DETAILED DESCRIPTION

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment or the like and may include a display mechanism, microphone, speaker and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

As used herein, IEEE 802.16 refers to one or more Institute of Electrical and Electronic Engineers (IEEE) Standard for Local and metropolitan area networks, Part 16: Air Interface for Fixed Broadband Wireless Access Systems, 1 Oct. 2004, IEEE Standard for Local and metropolitan area networks, Part 16: Air Interface for Fixed and Mobile Broadband Wireless Access Systems, 26 Feb. 2006, and any subsequent additions or revisions to the IEEE 802.16 series of standards.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as subchannels or tones). The subcarriers are modulated using BPSK (binary phase shift keying), QPSK (quadrature phase shift keying), QAM (quadrature amplitude modulation), and carry symbols including data coded using a forward error-correction code.

In accordance with an embodiment, a framer encodes each received application packet using its own code to generate a single codeword for the application packet. This permits the application packet to be encoded using the fewest codewords (i.e., one application packet encoded in one codeword). The resulting codeword is then split into a plurality of protocol data units (PDUs). The protocol data unit (PDU) refers to a packet that may include a header in the front and a cyclic redundancy check (CRC) appended to the end of the data, such as a hybrid automatic retransmission request (HARQ) PDU in conformance with the IEEE 802.16 standard. The PDUs from multiple received application packets are then interleaved prior to transmission. This interleaving helps to add time diversity to the transmission so that if an error burst occurs the error burst is spread across multiple application packets.

Figure 2:
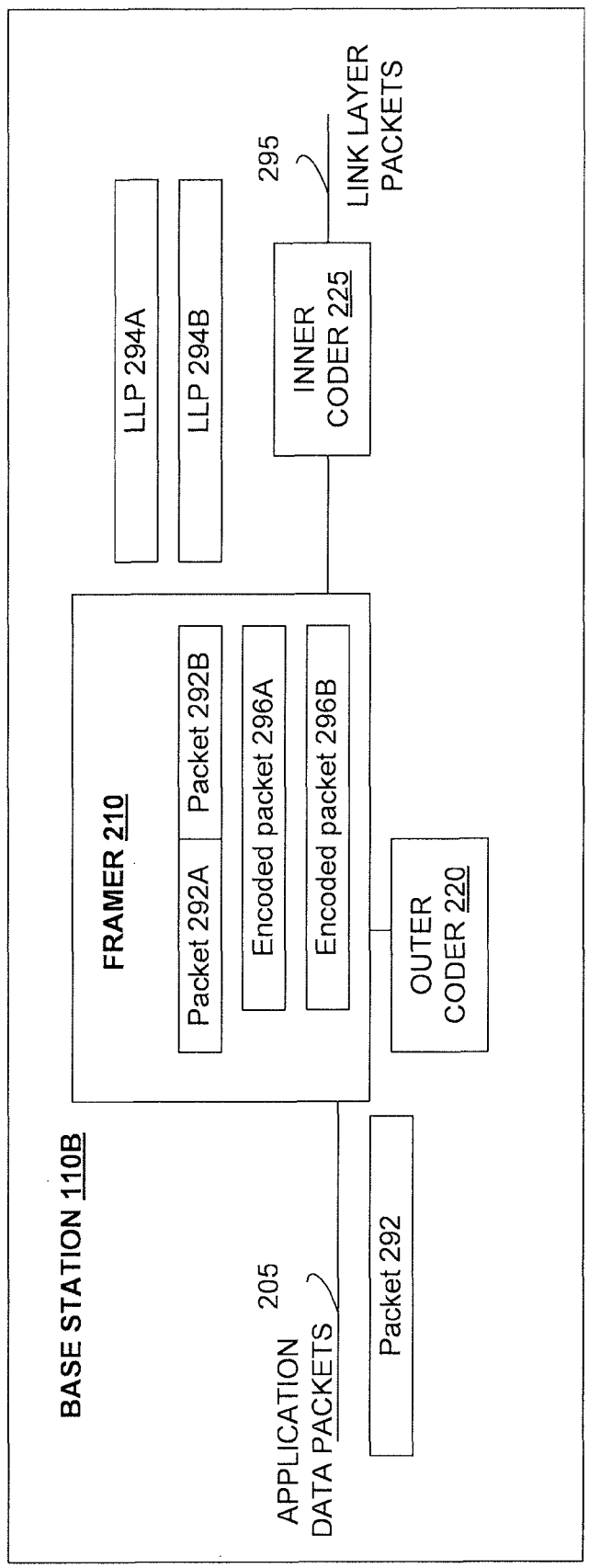
FIG. 2 depicts a block diagram of a base station including an application data packet.

FIG. 2 depicts an implementation of base station 110B. Base station 110B includes a framer 210, an outer coder 220, and an inner coder 225. These and other aspects of base station 110B will be described further below.

Figure 3:
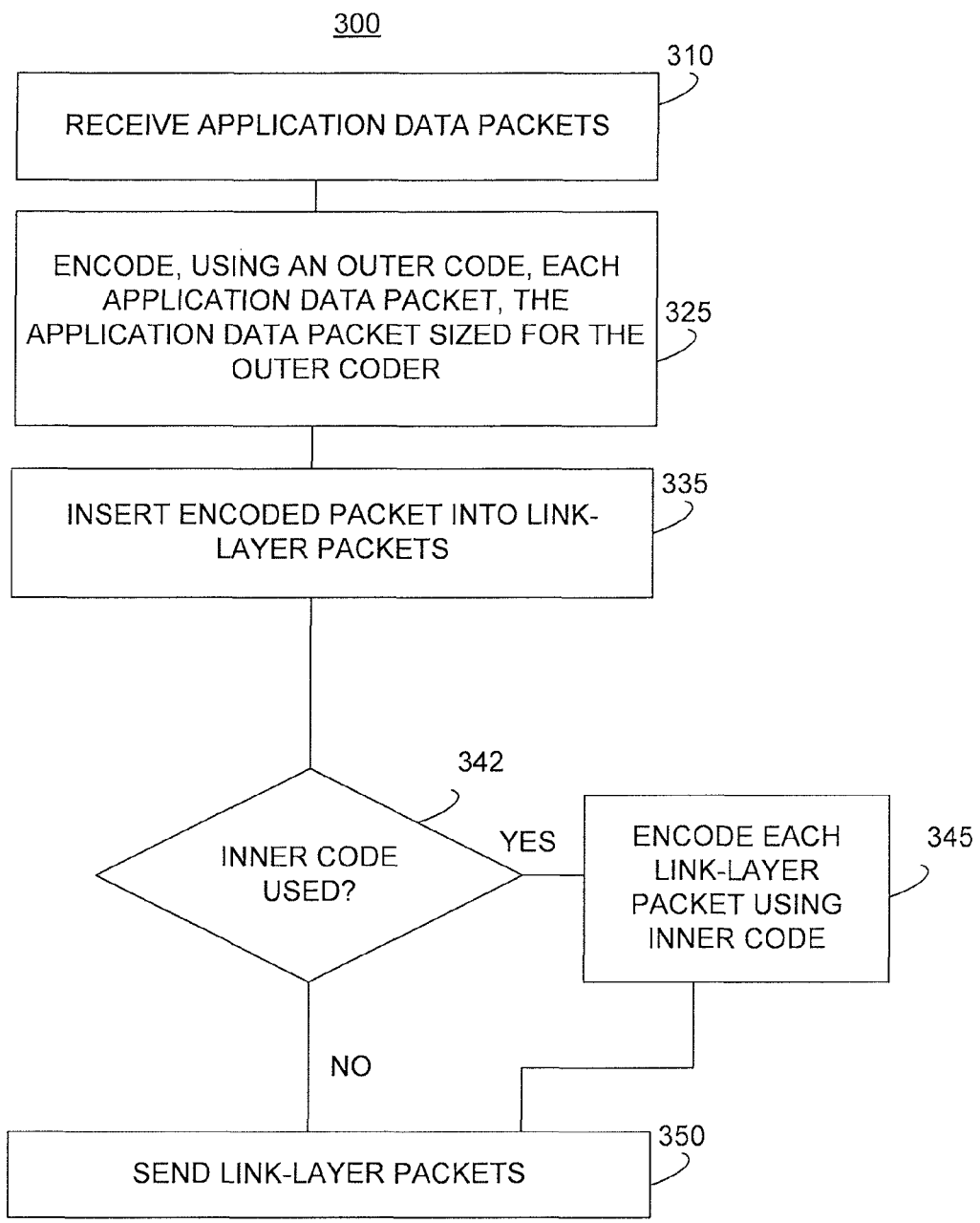
FIG. 3 depicts a process for using outer coding on an application data packet received at a base station.

FIG. 3 depicts a process 300 for using an outer code on packets. The description of process 300 refers to FIG. 2 as well.

At 310, one or more application data packets are received. In some implementations, base station 110A receives one or more application data packets 205. The application data packets 205 may be packets received from content link 126, two-way traffic link 128, a base station, or any other component of network 100. The application data packets 205 may include broadcast data, such as a digital video broadcast, although any other data may be included in application data packets. Packet 292, depicted at FIG. 2, is one of the application data packets 205.

At 325, outer coder 220 may encode each of the application data packets 205. Moreover, the application data packets 205 may be sized to be encoded by the outer coder. For example, the outer coder 220 may be implemented as a Reed-Solomon forward-error correction coder, such as a Reed-Solomon (RS) (255, 243) coder. In the case of an RS (255,243) coder, the outer coder 220 receives an input of 243 bytes, and outputs a codeword having 255 bytes, 12 bytes of which represent parity symbols. In this example, packet 292 would thus be sized to one or more groups of 243 bytes to allow the RS (255, 243) outer coder to encode the packet. For example, if packet 292 has a size greater than 243 bytes, packet 292, may be split into multiple packets each having a size less than 243 bytes. Moreover, the bytes comprising the constituent packets need not correspond to the contiguous set of bytes in the original packet. This will be the case if packets are written into the table vertically rather than horizontally. Packets 292A and 292B represent packet 292 after being sized (e.g., parsed to 243 bytes by the framer 210) into two pieces to allow the outer coder 220 to encode each of the packets 292A-B. Outer coder 220 receives packet 292A and outputs a codeword, which corresponds to encoded packet 296A, and then receives packet 292B and outputs another codeword, which corresponds to the encoded packet 296B. Various techniques may be used for sizing the packets without departing from the invention. In one example, the outer coder 220 may be able to vary the parameters of the forward error correction code. For example, the outer coder may be able to encode the packet(s) using a Reed Solomon code, where the maximum input is 243 bytes and the maximum resulting codeword is 255. That is, in this example, the maximum Reed Solomon code is a RS (255,243) code. However, if outer coder 220 is to encode a packet having a size less than 243 bytes, the outer coder may apply a Reed Solomon code having a smaller size. Thus, for example, in the example, if application packet 292 has a size of 400 bytes, outer coder 220 may size the packet to two packets 292A and 292B of 200 bytes each, and then encode the two packets using a Reed Solomon code with an input of 200 bytes, such as, for example, a RS (240, 200) code. It should be noted that these exemplary sizes are provided for illustrative purposes only, and other sizes and types of codes may be used. Additionally, this example provides but one illustrative example of a technique that may be utilized for sizing a packet so that it is smaller than the maximum input size for the forward error correction code, and other techniques may be utilized for sizing the packets. For example, in other embodiments, the code configuration used may be fixed at its maximal length, and a code block designed to contain the largest possible packet may be defined as the basic container size. For example, if there is known to be an upper limit of 1800 bytes for application packets, and a maximal available codeword size of 255, a block comprised of 8 code words, each being an RS(255,243) code may be used. After a packet is inserted into the block, there might be two approaches in inputting the next packet into a block. In the first, the next packet is input into the next block. In the second, a fragment of the packet may be input into the current block, filling it completely, and the rest of the packet may be then input to the next block. Note that in both cases no application packet spans more than two blocks.

At 335, the encoded packets (e.g., which are output by outer coder 220) are inserted into link-layer packets for transmission. In some implementations, framer 210 inserts each packet encoded by the outer coder 220 into a link-layer packet for transmission. For example, the encoded packet 296A is inserted into a link-layer packet 294A, and the encoded packet 296B is inserted into link-layer packet 294B. The phrase "link-layer packets" refers to a type of packet that may be exchanged between a base station and a client station. For example, in some embodiments, the link layer packet may be a protocol data unit (PDU) that includes a header in the front and a cyclic redundancy check (CRC) appended to the end of the data by a CRC generator, such as a hybrid automatic retransmission request (HARQ) PDU in conformance with the IEEE 802.16 standard. The link layer packet may be a PDU that does not include a header. It may alternatively not have an appended CRC. If neither a header nor a CRC are present, the link-layer packet is instead simply the read data block. In any of the cases, the link layer packet may be subsequently coded using an inner code applied by inner coder 225.

In some implementations, an inner code is also used to further encode the link-layer packet (yes at 342), while in other cases the inner code is not used (no at 342). When the inner code is used at 345, inner coder 225 uses an inner code to encode each of the link-layer packets. The inner coder 225 may encode the link-layer packets using one or more error-correction or forward error-correction coding schemes, such as a Convolution Code (CC), a Convolutional Turbo Code (CTC), and the like.

At 350, the base station 110B sends the link-layer packets to a client station, such as client station 114A. When the inner code is not applied to the link-layer packets, base station 110B sends those packets through the wireless network to client station 114A, relying on the outer code to provide forward error-correction. When the inner code is applied, base station 110B sends through the wireless network to client station 114A the link-layer packets encoded with an outer code concatenated with an inner code. When the link-layer packets are implemented as a PDU including an appended CRC (which is the case when the PDUs are HARQ PDUs), a CRC generator applies the CRC to the link-layer packets. Moreover, base station 110B may include other components to facilitate transmission, such as a radio frequency (RF) front-end comprising an antenna to transmit an RF signal, such as a downlink to client station 114A. The RF front-end may also include other components, such as filters, converters (e.g., digital-to-analog converters and the like), an Inverse Fast Fourier Transform (IFFT) module, and symbol mappers. These and other components may be used to modulate data, such as the link-layer packets, onto the RF signal transmitted by base station 110B. In some implementations, the base station 110B is compatible with IEEE 802.16 and transmits an RF signal configured as an OFDMA signal, including subcarriers carrying the link-layer packets. With regard to 350, in some implementations, so-called "fine interleaving" is used. When fine interleaving is used, link-layer packets need not be transmitted at 350 in the order they are received. Also, coarse interleaving, where link-layer packets from other outer code blocks are multiplexed with those of the packet stream of interest prior to being transmitted over the air may be applied at 350 as well.

Figure 4:
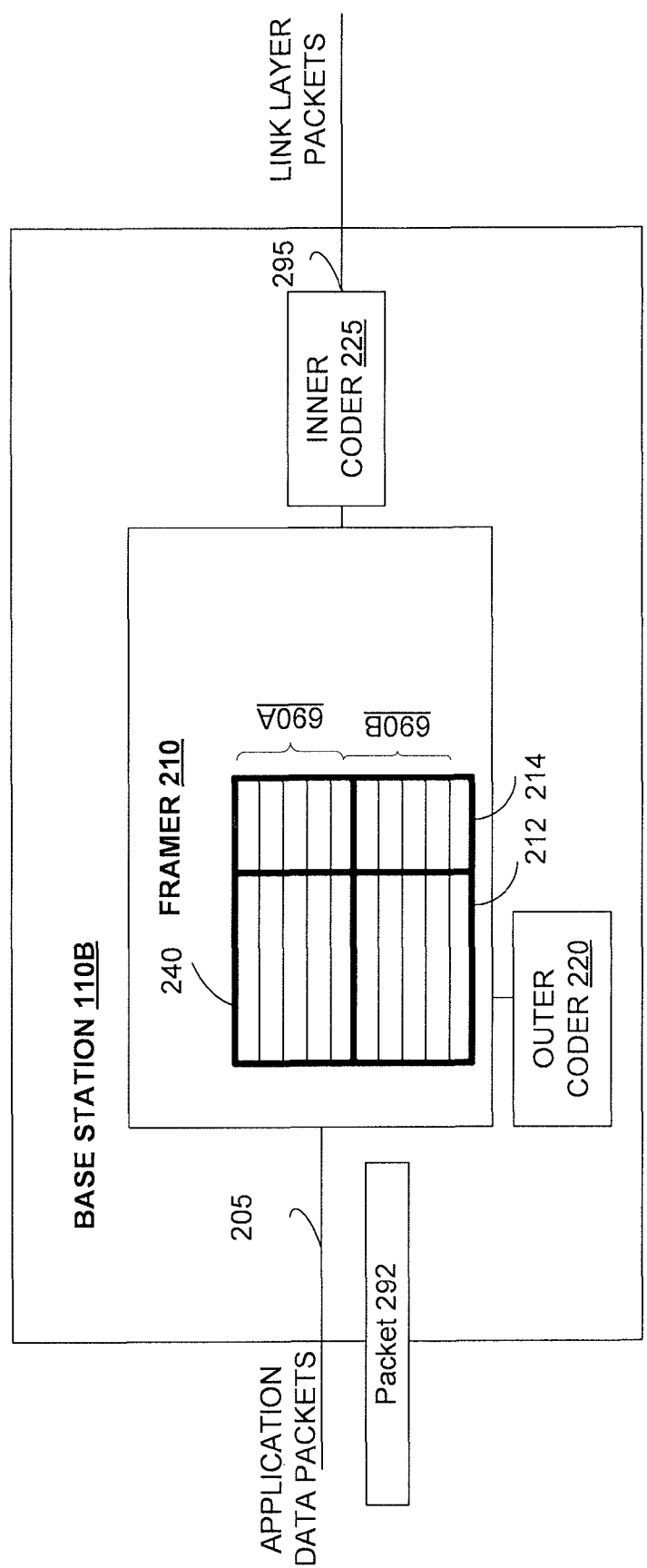
FIG. 4 depicts another block diagram of a base station including an outer coder configured to use code blocks.

FIG. 4 depicts another implementation of base station 110B including code blocks 690A-B. In the example implementation of FIG. 4, framer 210 inserts each of the application data packets into a code block. The phrase "code block" refers to a portion of frame 240, which will be encoded as a block by outer coder 220. In some implementations, the code block is configured to be large enough to accommodate the length in bytes of each of the application data packets. For example, in a given system, if the maximum size of the application data packets is 1000 bytes, a code block may be sized to 243 columns and 5 rows (e.g., 5×243=1215 bytes) to accommodate the largest application data packets.

In some implementations, frame 240 is configured to include an application data table 212 and a parity table 214. For example, an application data packet is inserted into 5 rows of code block 690A of frame 240 and, in particular, the application data table 212 portion of frame 240. When outer coder 220 encodes the 5 rows of application data table 212, outer coder 220 generates parity symbols which it inserts into the parity table 214 portion of code block 690A. Framer 210 can then read the encoded code block 690A and insert (e.g., pack) the encoded code block into one or more link-layer packets. Likewise, subsequently received application data packets 205 are inserted by framer 210 into the 5 rows of a code block of frame 240 (e.g., in the application data table 212 portion of frame 240), encoded by outer coder 220, read as an encoded code block, and inserted into link-layer packets. The above-description of a code block comprising 5 rows of frame 240 is only exemplary as other sized code blocks may be used as well.

Furthermore, frame 240 may be stored in a storage medium such as, for example volatile or non-volatile storage mediums. Exemplary volatile storage mediums include random access memory (RAM), such as dynamic RAM (DRAM), static RAM (RAM), and the like. Exemplary non-volatile storage mediums may include magnetic RAM (MRAM), battery backed RAM, and the like. Moreover, the memory provided by the storage medium is typically addressed by rows and columns, such that a memory location can be identified by its row and column. For example, framer 210 may write to and read from frame 240 using the row and column addresses of frame 240 and those read-write operations may result in an access to a corresponding location in memory (e.g., the location in memory being addressed as a row and column in memory using a virtual address or a physical address in memory).

Figure 5:
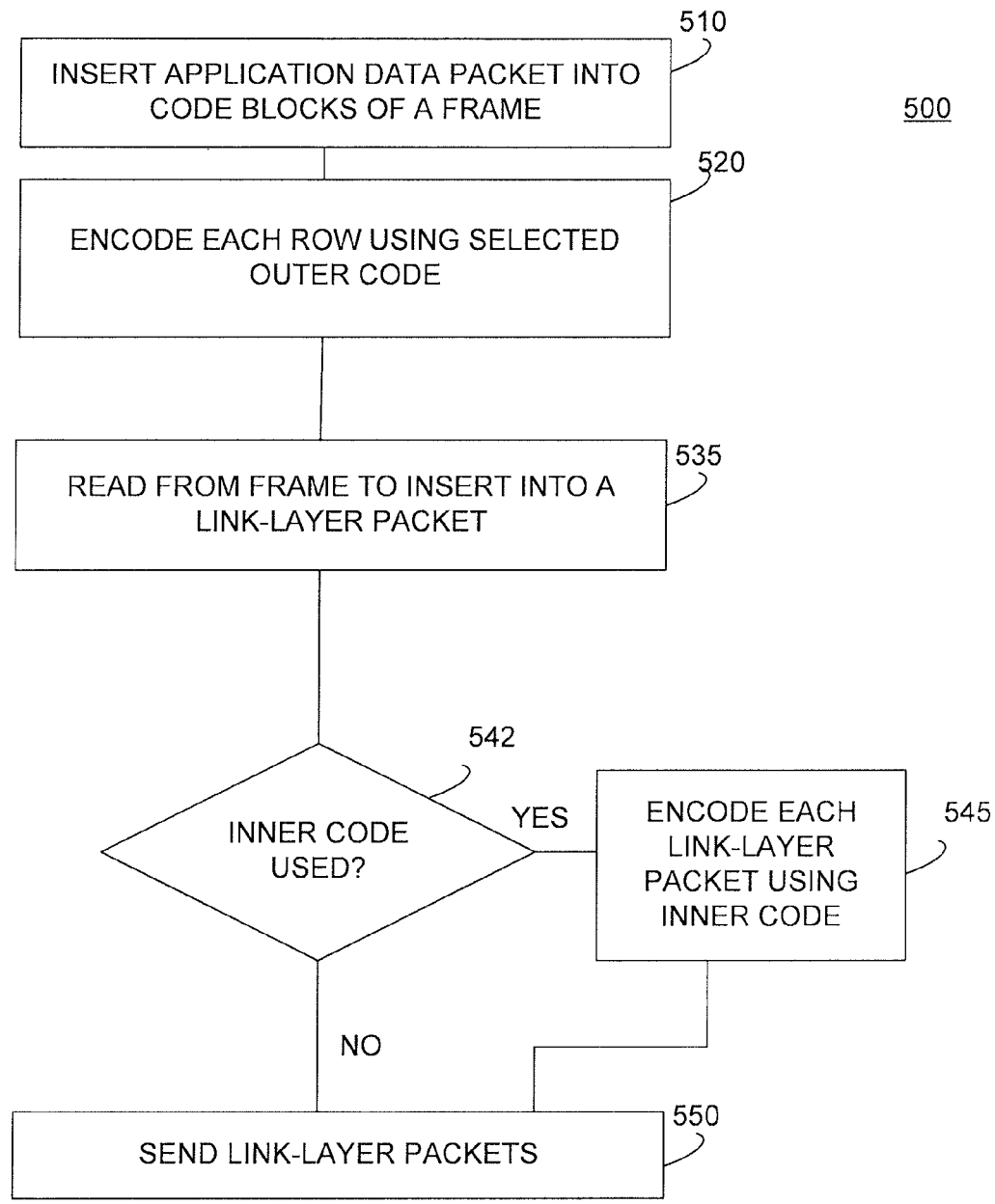
FIG. 5 depicts a process for using code blocks at a base station.

FIG. 5 depicts a process 500 for using code blocks to encode application data packets. The description of process 500 will refer to FIGS. 4, 5, and 6A-D.

At 510, base station 110B may insert one of the application data packets 205, such as packet 292, into an application data table 212 of frame 240. To insert the received packet 292 into application data table 212, framer 210 inserts packet 292 into a code block, such as code block 690A. Framer 210 inserts another application packet (e.g., a subsequently received application data packet) into another code block, such as code block 690B, and so forth inserting each subsequent application data packet in one of the code blocks of frame 240. Although the above describes inserting one application data packet into one code block, in some embodiments, a plurality of application data packets may be inserted into the code block and/or a packet may span as many as two blocks.

Figure 6A:
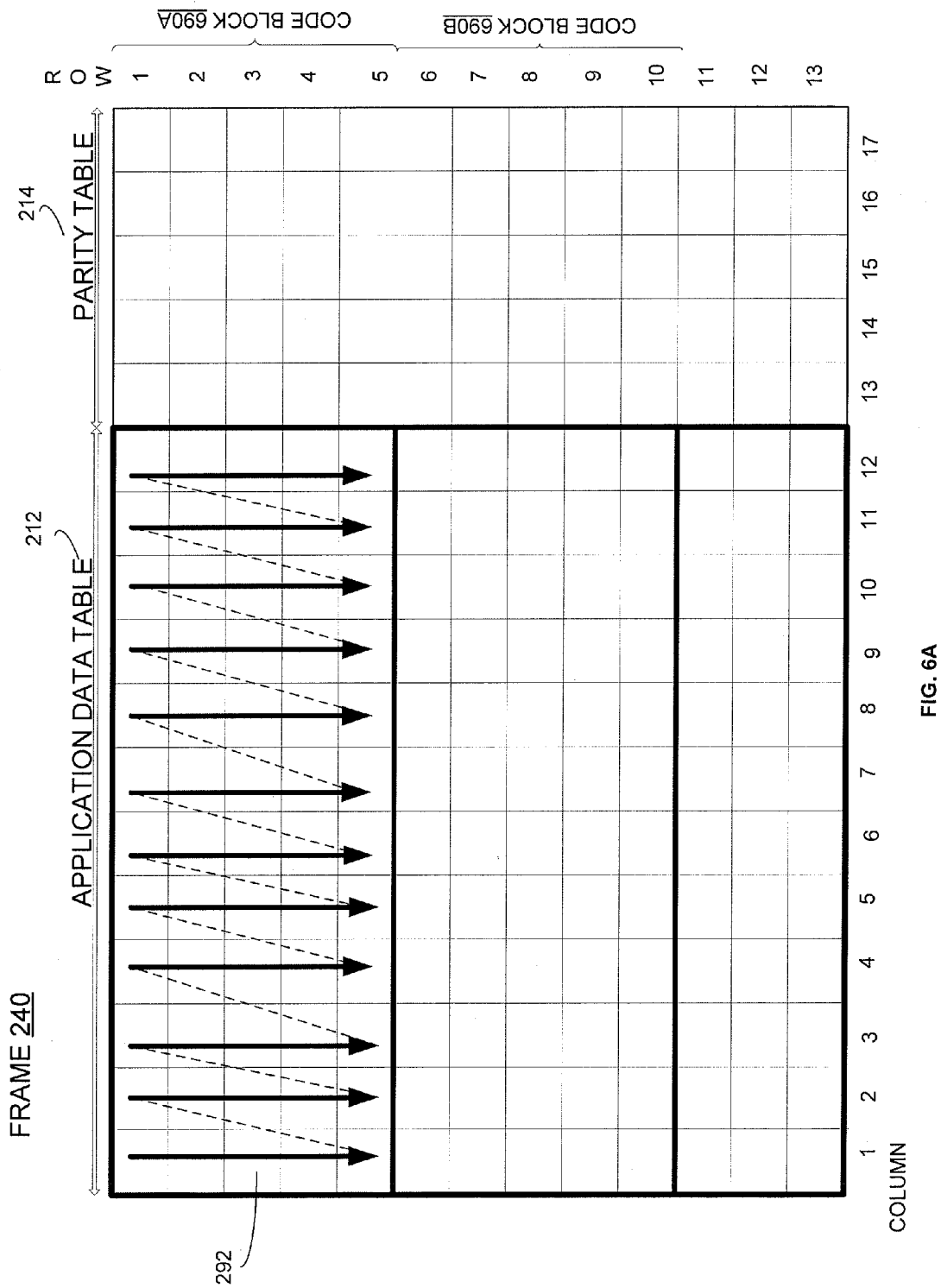
FIGS. 6A, 6B, 6C, and 6D depict examples of frames at various stages at the base station.
Figure 6B:
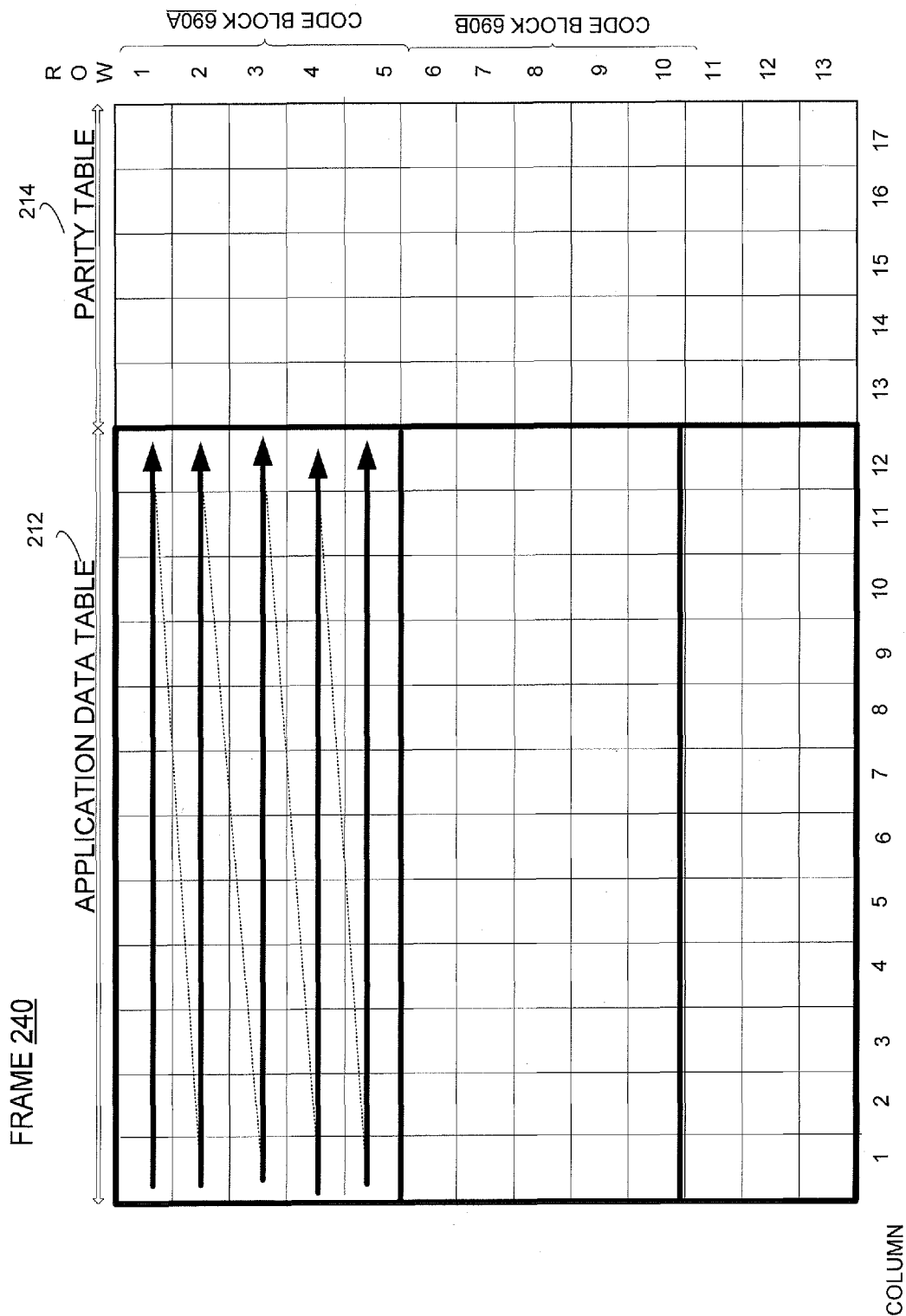

FIGS. 6A and 6B depict frame 240 including application data table 212 divided into code blocks comprising 5 rows.

Referring to FIG. 6A, the packet 292 is inserted in a column-by-column pattern into code block 690A. Referring to FIG. 6B, the packet 292 is inserted in a row-by-row pattern into code block 690A. Regardless of which pattern is used, each subsequent application data packet that is received at framer 210 is inserted into one of the code blocks. Although frame 240 is depicted at FIGS. 6A and 6B as a table of 17 columns and 13 rows, other values of rows and columns may be used as well. Moreover, although the above examples describe a code block including 5 rows, other sizes of code blocks may be used as well.

Figure 6C:
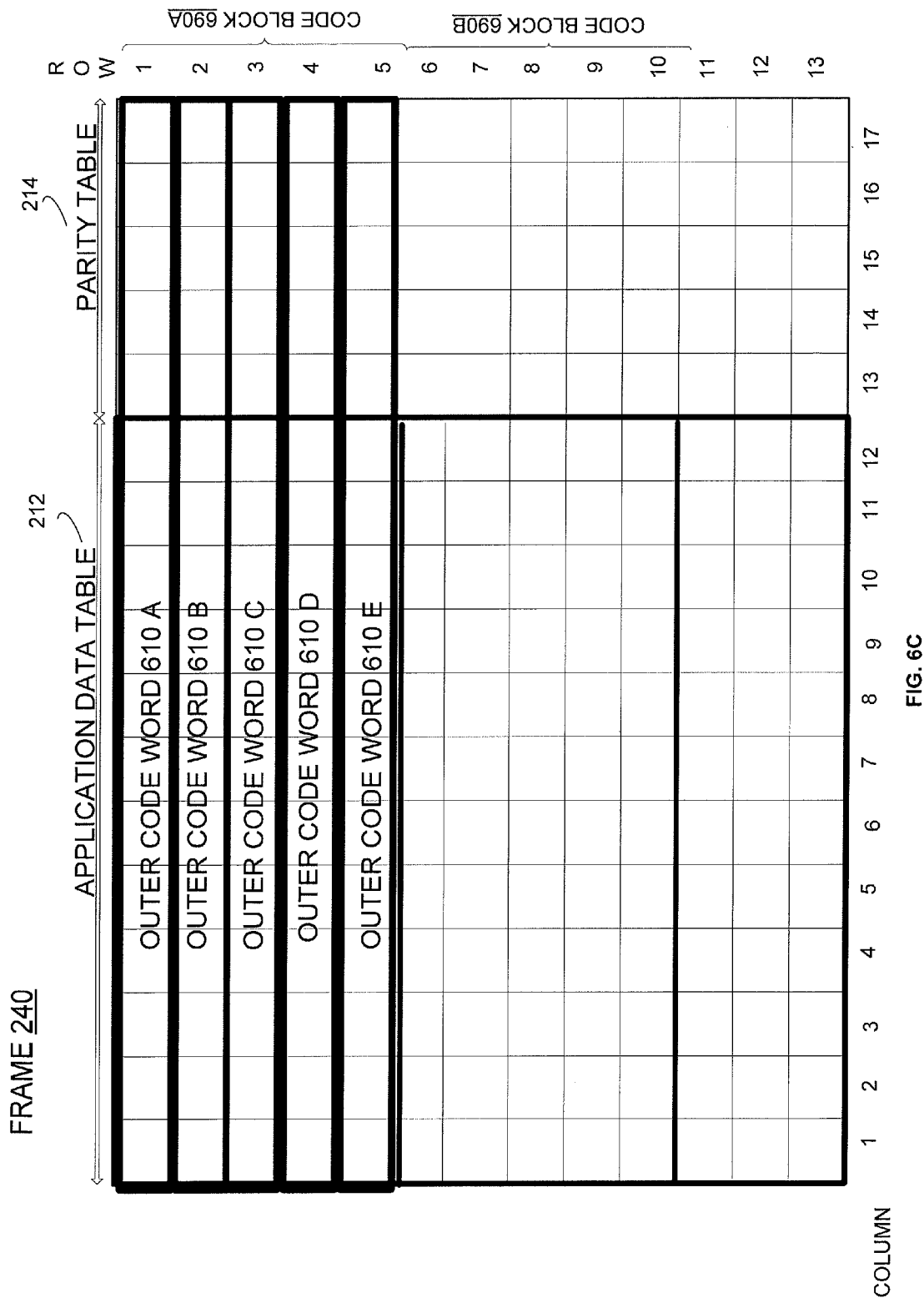

At 520, outer coder 220 encodes each row of application data table 212 using an outer code. In some implementations, outer coder 220 is implemented as a forward error-correction coder, such as a Reed-Solomon forward error-correction coder or a low-density parity check (LDPC) coder, although other error-correction or forward error-correction coders may be used as well. As each row of frame 240 is encoded using an outer code, outer coder 220 inserts into parity table 214 any parity symbols generated by the outer code. For example, when a Reed-Solomon (RS) (255,243) coder is used, each row of frame 240 would include parity symbols having a length of 12, which would be inserted into parity table 214 by outer coder 220. FIG. 6C depicts frame 240 after the 5 rows of the code block have been encoded by the outer coder 220 into codewords 610A-E, each including, for example, 5 parity symbols in parity table 214.

Figure 6D:
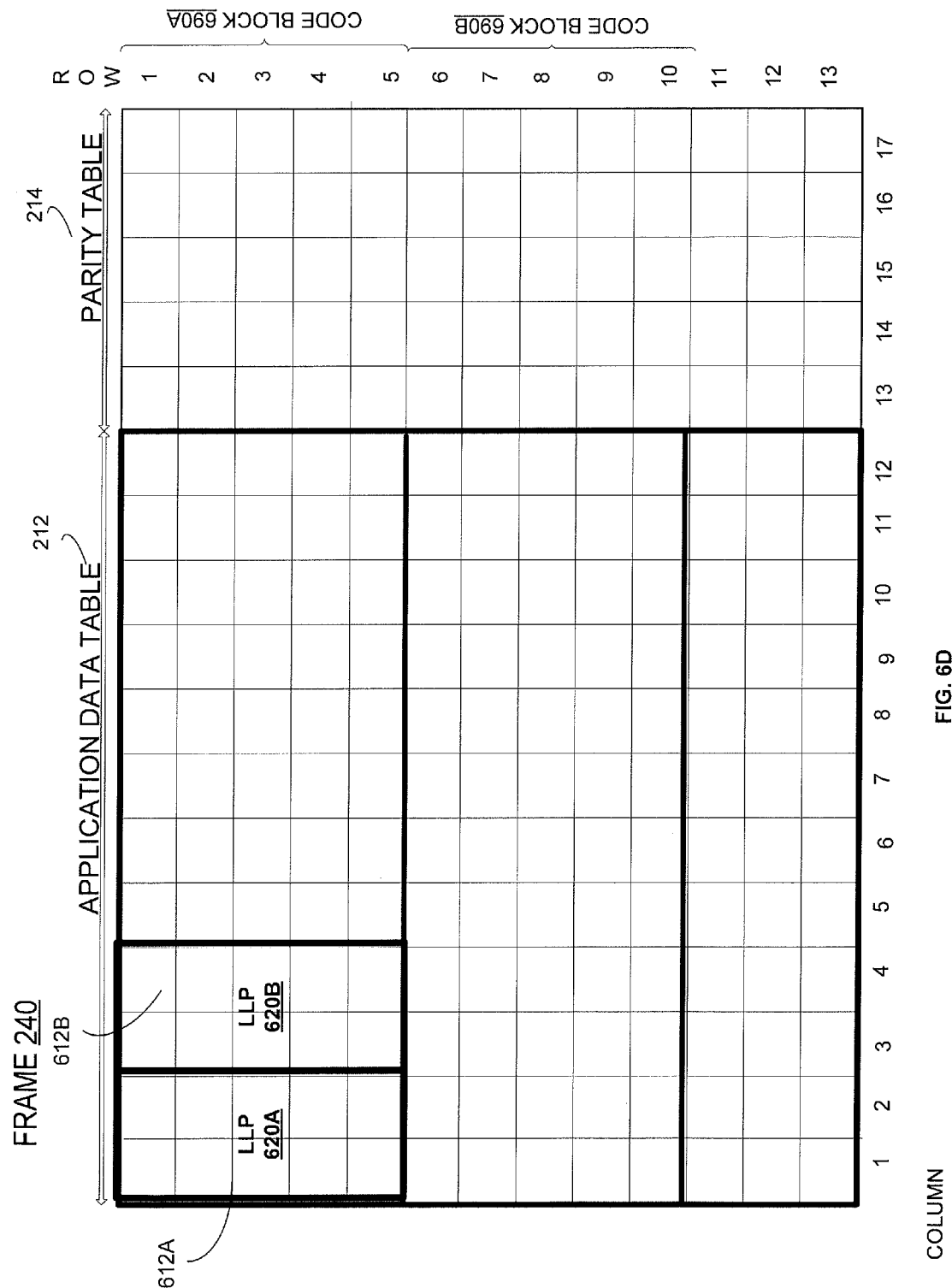

At 535, framer 210 reads one or more bytes from the frame 240 to be inserted (e.g., pack) into link-layer packets. For example, once a code block has been encoded by the outer coder, framer 210 may read a portion (e.g., one or more bytes) of the code block to form link-layer packets. FIG. 6D depicts frame 240 including a portion 612A of the code block 690A that is read and then inserted into a link-layer packet 620A. Framer 210 also reads another portion 612B, which is inserted into link-layer packet 620B. Framer 210 continues to read additional portions of the code block 690A until the entire encoded code block of frame 240 is read and packed into link layer packets. Moreover, framer 210 additionally reads portions from additional code blocks, such as the code block at rows 6-10 and so forth, and inserts those portions into corresponding link-layer packets. Although FIG. 6D depicts each of the link-layer packets 620A-B as having 10 bytes (e.g., 2 columns by 5 rows), the link-layer packets may have other sizes as well. Moreover, framer 210 may, in some implementations, read portions in any order (e.g., portion 612B may be read and inserted in to a link-layer packet 620B, and then portion 612A may be read and inserted into link-layer packet 620A).

In some implementations, an inner code is also used to further encode the link-layer packets (yes at 542), while in other cases an inner code is not used (no at 542). When the inner code is used at 545, inner coder 225 uses an inner code to encode each of the link-layer packets, such as described above with reference to step 342 of FIG. 3. As noted above, the inner coder 225 may apply an inner code to the link-layer packets using one or more error-correction or forward error-correction coding schemes, such as a Convolution Code (CC), a Convolutional Turbo Code (CTC), and the like.

At 550, the base station 110B sends the link-layer packets to a client station, such as client station 114A in a manner similar to the description of 350 at FIG. 3.

Figure 7:
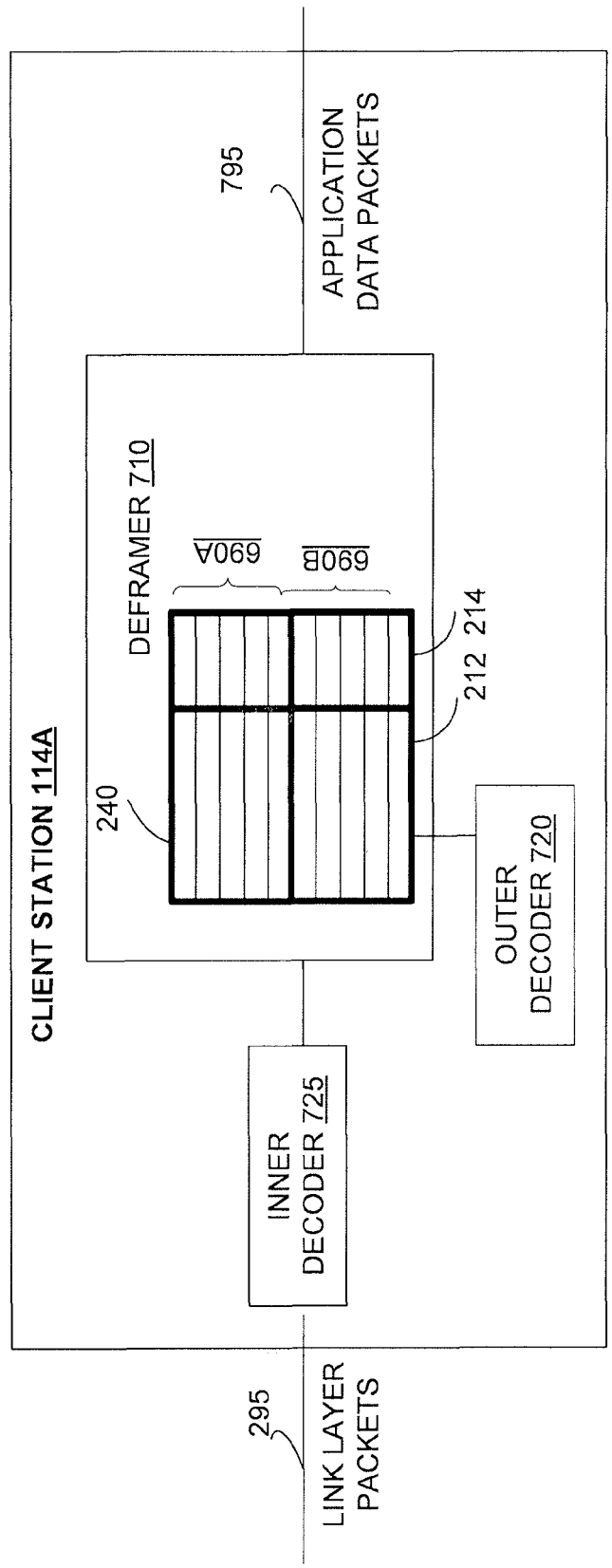
FIG. 7 depicts a block diagram of a client station.

FIG. 7 depicts a client station 114A. Client station 114A includes an inner decoder 725 for decoding received packets using an inner code, a deframer 710, and an outer decoder 720 for decoding using an outer code. These and other aspects of client station 114A will be described further below.

Figure 8:
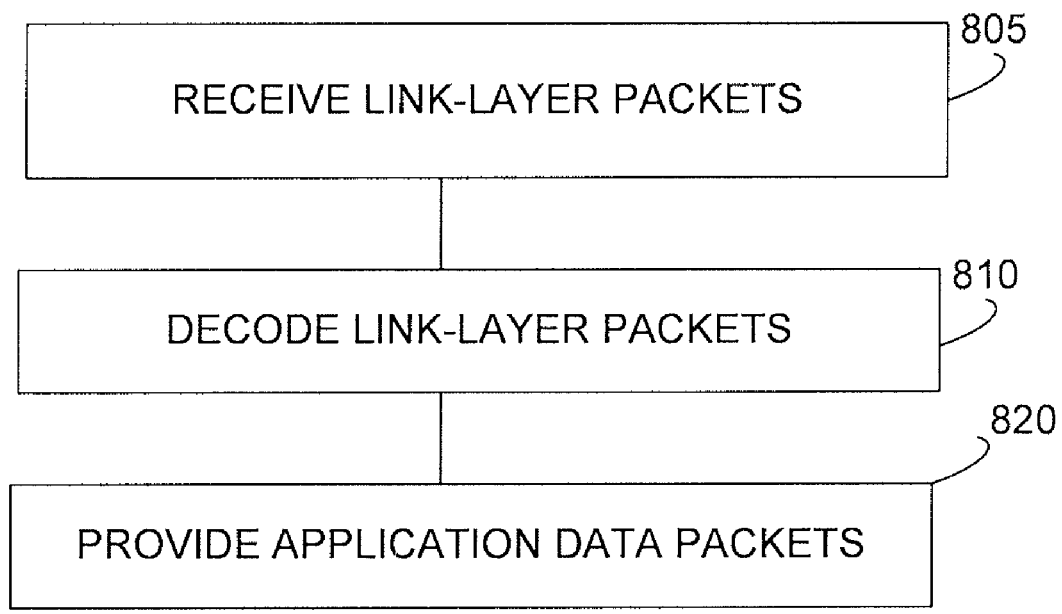
FIG. 8 depicts a process for decoding link-layer packets at the client station.

FIG. 8 depicts a process 800 for decoding, at the client station 114A, packets (e.g., link-layer packets 295) received from a wireless network and base station 110B. The description of process 800 also refers to FIG. 7.

At 805, client station 114A receives one or more link-layer packets 295 from a wireless network and base station 110B. Client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets transmitted by base station 110B and carried by the RF signal. In some implementations, the client station 114A is compatible with IEEE 802.16 and receives an RF signal configured as an OFDMA signal, including subcarriers carrying the link-layer packets.

At 810, the received link-layer packets are decoded. The link-layer packets are decoded in a manner dictated by the outer and inner coding process used at the base station. In other words, the link-layer packets should be processed to remove the outer code and, if used, the inner code to enable recovery of the application data packets 205, which were coded and transmitted by the base station 110B.

Moreover, when each application data packet is encoded as described above with respect to FIG. 2 and process 300, the client station 114A may receive each of the link-layer packets, and inner decoder 725 (using the same inner code used at base station 110B) removes any inner coding, if applied, and the outer decoder 720 removes the outer code using the same outer code used to encode each of the packets at the base station. For example, if an RS (255, 243) code is used by the outer coder 220 at the base station 110B, outer decoder 720 uses the same RS (255, 243) code to decode the packet. Further, if the packets were parsed to break the packet into two separate encoded codewords, deframer 710 recombines the separate codewords into a single application packet. In one example, after outer decoder 720 decodes the codewords, deframer 710 may read the header of the resulting decoded packets to determine the length of the application packet and use this information in determining how to reassemble the application packet if the packet was parsed. For example, if the header of the application packet indicates that the size of the packet is greater than the maximum size of the code, then deframer 710 may determine that the packet was parsed and deframer 710 may accordingly combine the packet with the decoded subsequent packets to provide the application packet of the size specified in its header. It should be noted that this is but one technique for recombining application packets, and other techniques may be used without departing from the invention. The output of the outer decoder 720 is one or more application data packets, which can be provided to other components of the client station.

Furthermore, when each application data packet is encoded as described above with respect to FIG. 4 and process 500, the client station 114A may receive link-layer packets, and inner decoder 725 removes any inner coding, if applied by the base station 110B. Next, the packet is inserted into, for example, code blocks 690A-B of frame 240. The outer decoder 720 then decodes the code blocks using the same forward-error correction code used to encode that packet at the base station. The output of the outer decoder 720 is one or more application data packets, which can be provided to other components of the client station.

Figure 9:
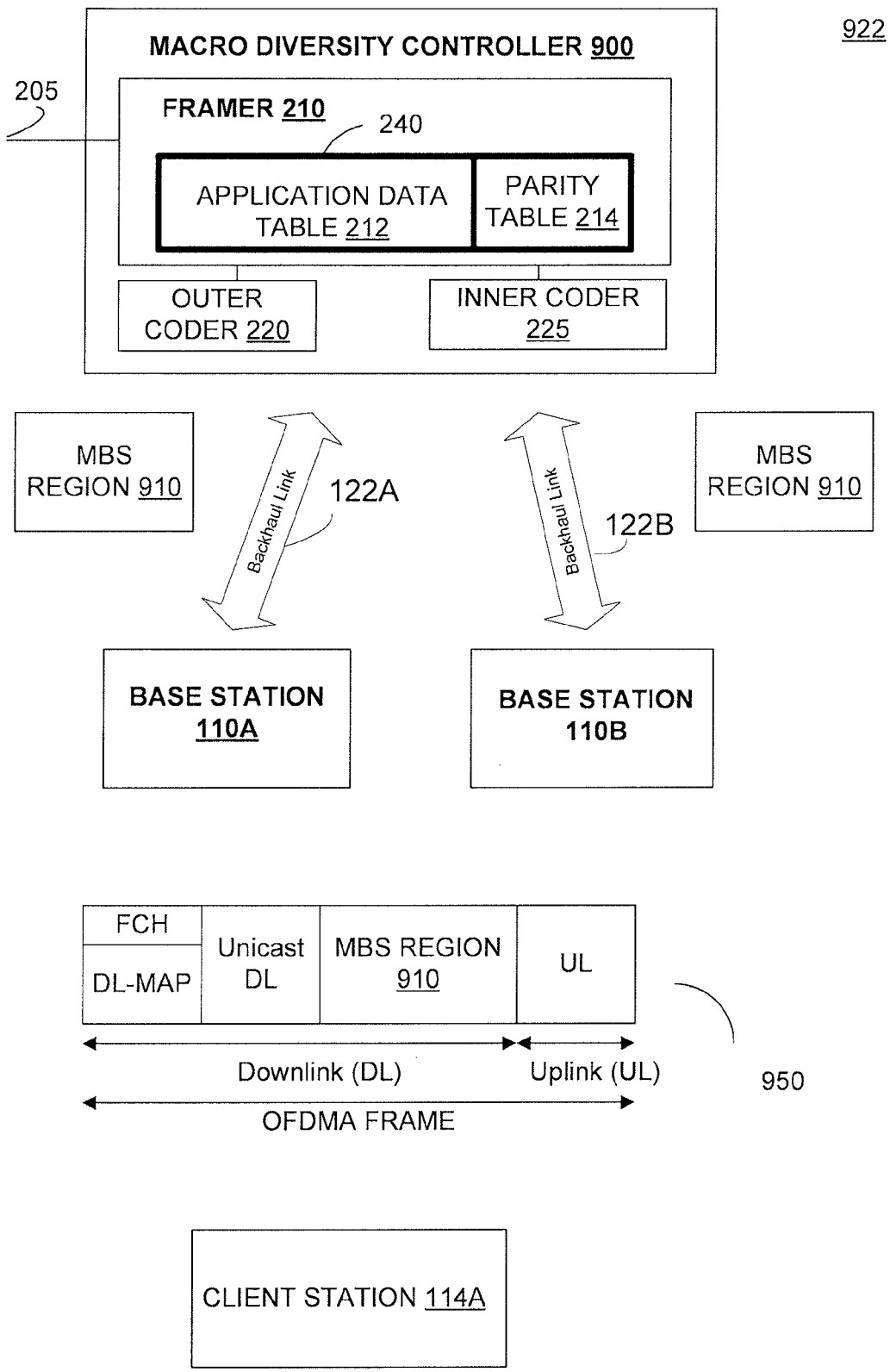
FIG. 9 depicts a block diagram of a controller implementing outer coding.

FIG. 9 depicts an implementation of framer 210, outer coder 220, and inner coder 225 in a macrodiversity controller 900. Moreover, client station 114A may include an inner decoder 725, outer decoder 720, and deframer 710 as described above with respect to FIGS. 7 and 8.

At macrodiversity controller 900, the output of the inner coder 225 may be link-layer packets that are used as protocol data units (PDUs), such as HARQ PDUs in conformance with IEEE 802.16. The PDUs are inserted into a macrodiversity region, such as a multicast and broadcast region (MBS) consistent with IEEE 802.16. As used herein, the phrase "macrodiversity region" refers to any type of data region of a data frame usable for multicast or broadcast data. The macrodiversity controller 900 distributes the MBS region 910 to zero or more base stations 110A-B. The macrodiversity controller 900 also schedules the transmissions of MBS regions 910 at base stations 110A and 110B, such that the base stations synchronously transmit the MBS regions over the same frequency using the same waveform (e.g., same modulation and coding scheme), and using the same framing parameters (e.g., number of symbols in the OFDMA frame, length of symbol, cyclic prefix, and the like). In the present embodiment, the base stations 110A and 110B each insert the MBS region 910 into an OFDMA frame 950. The base stations then transmit the OFDMA frame 950 to client stations, such as client station 114A. The MBS region 910 is transmitted using macrodiversity, while other portions of the OFDMA frame 950 may not use macrodiversity.

At the client station, such as client station 114A, macrodiversity provides a so-called "macrodiversity gain" by combining the synchronous broadcast transmitted by base stations 110A and 110B. For example, base station 110A and base station 110B would each transmit frame 950 including the frame control header (FCH), downlink map (DL-MAP, and unicast downlink (DL) without using macrodiversity. Although the same MBS region is broadcast using macrodiversity from base stations 110A-B, the other data regions, such as the unicast downlink, may be unique to each base station. Client station 114A may then receive the link-layer packets 295 as the content carried by the data regions, such as the MBS region 910A.

Although the example of FIG. 9 refers to two base stations 110A-B, there may be additional base stations operating using macrodiversity to transmit MBS regions. Moreover, in the example of FIG. 9, the outer coder 220 would use the same RS code in a particular zone, such as a geographic area, to allow macrodiversity. However, in some implementations, the same system 922 includes a second macrodiversity controller with a different outer code in its outer coder, in which case the system 922 may provide another zone of macrodiversity using the other outer code. In some implementations, the macrodiversity controller 900 may receive packets 205 corresponding to streams of multimedia content, such as digital broadcast television and the like, with each stream associated with one or more zones. Moreover, although FIG. 9 depicts the macrodiversity controller 900 as separate from base stations 110A, 110B, and network controller 124, macrodiversity controller 900 may be incorporated into (or coupled to) at least one of a base station, a network controller, and the like.

Although the examples described herein are described in connection with, for example, a base station sending packets to a client station, the subject matter described herein may be used in other applications. For example, subject matter described herein may be used to provide an outer code on data sent to a storage device, such as a hard drive or optical storage device.

The above described subject matter may, in some implementations reduce correlation between errors occurring in received application packets.

The subject matter described herein may be embodied in systems, apparatus, methods, and/or articles depending on the desired configuration. In particular, various implementations of the subject matter described, such as the components of base stations, client stations, and macrodiversity controller, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of base stations, client stations, and macrodiversity controller and aspects of processes 300, 500, and 800 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Moreover, the rows and columns of the frame can be swapped (e.g., by rotating the frame by 90 degrees), in which case the above noted processes and systems continue to be operative. Other embodiments may be within the scope of the following claims.

What is claimed is:

1. A method comprising:
   receiving a packet comprising information;
   encoding the received packet using a forward error correction code to provide at least one, but no more than two, codewords;
   inserting at least a portion of each codeword into a transport packet for transmission to a client station, wherein the transport packet comprises information from at least one, but no more than two, of the codewords; and
   sending the transport packet.

2. The method of claim 1, further comprising:
   sizing the packet based on a size parameter of the forward error correction code by parsing the packet if the packet has a size exceeding the size parameter to provide two sub-packets; and wherein encoding the received packet, comprises encoding each sub-packet to provide a corresponding codeword; and
   inserting the encoded packet into another packet for transmission to a client station.

3. The method of claim 1, wherein encoding further comprises: encoding at least a portion of the packet as a block, the block sized according to a size parameter of the forward error correction code.

4. The method of claim 1, wherein the forward error correction code is a Reed-Solomon forward-error correction code.

5. The method of claim 1 further comprising:
   encoding, using a second code, the transport packet.

6. The method of claim 1 wherein the transport packet is a hybrid automatic retransmission request (HARD) protocol data unit (PDU) that comprises a cyclic-redundancy check (CRC) and a header.

7. A method comprising:
   receiving a transport packet;
   obtaining at least a portion of at least one, but no more than two, codewords from the transport packet, wherein the codewords were encoded using a forward error correction code;
   decoding the codewords to obtain at least one application packet, wherein each codeword includes at least a portion of one, but no more than two, application packets; and
   providing the decoded application packet.

8. The method of claim 7, wherein the received packet was sized based on a parameter of the forward error correction code by parsing the application packet if the application packet has a size exceeding the size parameter.

9. The method of claim 7, wherein decoding further comprises: decoding at least a portion of the packet as a block, the block sized according to a size parameter of the forward error correction code.

10. The method of claim 7, wherein the forward error correction code is a Reed-Solomon forward-error correction code.

11. A method comprising:
    receiving a packet comprising a number of information bits wherein the number of information bits is less than or equal to a maximum packet size;
    inserting the packet into a code block, wherein the code block when encoded comprises a number of codewords each capable of carrying a particular number of information bits, and wherein the number of codewords is the smallest number of codewords enabling the code block to hold a packet with a size equal to the maximum packet size;
    encoding the code block using a forward error correction code to provide the number of codewords;
    inserting at least a portion of the code block into a transport packet for transmission to a client station, wherein the transport packet comprises information from no more than two code blocks; and
    sending the transport packet.

12. The method of claim 11, wherein receiving further comprises:
    inserting the received packet row-by-row into one or more rows of the code block; and
    encoding the code block after the row-by-row inserting.

13. The method of claim 11, wherein receiving further comprises:
 inserting the received packet column-by-column into the code block; and
 encoding the code block after the column-by-column inserting.

14. The method of claim 11, wherein encoding further comprises:
 encoding, using a Reed-Solomon forward-error correction coder to provide the outer code, the code block configured as an input of the Reed-Solomon forward-error correction coder.

15. The method of claim 11 further comprising:
 encoding, using an inner code, the code block encoded with the outer code.

16. The method of claim 1, wherein sending further comprises:
 sending the other packet as at least one of a link-layer packet and a hybrid automatic retransmission request (HARD) protocol data unit (PDU).

* * * * *